(12) United States Patent
Borisuk et al.

(10) Patent No.: US 11,498,301 B2
(45) Date of Patent: Nov. 15, 2022

(54) PRESS HEAD FOR A PRESS MACHINE

(71) Applicant: TE CONNECTIVITY CORPORATION, Berwyn, PA (US)

(72) Inventors: Peter John Borisuk, Abington, PA (US); Mark Andrew Ondo, Harrisburg, PA (US); Frank Raymond Corkran, Duncannon, PA (US); Thomas W. Salois, Harrisburg, PA (US)

(73) Assignee: TE Connectivity Solutions GmbH

( * ) Notice: Subject to any disclaimer, the term of this patent is extended or adjusted under 35 U.S.C. 154(b) by 480 days.

(21) Appl. No.: 15/961,030

(22) Filed: Apr. 24, 2018

(65) Prior Publication Data
US 2019/0322064 A1 Oct. 24, 2019

(51) Int. Cl.
*B30B 15/00* (2006.01)
*B30B 15/06* (2006.01)
*H01R 43/20* (2006.01)
*H01R 12/70* (2011.01)
*B30B 15/04* (2006.01)

(52) U.S. Cl.
CPC ........ *B30B 15/0094* (2013.01); *B30B 15/041* (2013.01); *B30B 15/062* (2013.01); *H01R 12/7064* (2013.01); *H01R 43/205* (2013.01)

(58) Field of Classification Search
CPC . H01R 43/205; B30B 15/0094; B30B 15/041; B30B 15/062
See application file for complete search history.

(56) References Cited

U.S. PATENT DOCUMENTS

| 4,367,583 A | 1/1983 | Baccei |
| 4,491,027 A * | 1/1985 | Yalof ................. B30B 15/0094 73/862.52 |
| 5,499,443 A | 3/1996 | Ota et al. |
| 2005/0037644 A1 | 2/2005 | Ravert, Jr. et al. |

FOREIGN PATENT DOCUMENTS

| JP | 2008126257 A * | 6/2008 | |
| KR | 100369080 B1 * | 1/2003 | ......... B30B 15/0094 |

OTHER PUBLICATIONS

International Search Report, International Application No. PCTIB2019/052920, International Filing Date, Apr. 9, 2019.

* cited by examiner

*Primary Examiner* — Livius R. Cazan

(57) ABSTRACT

A press head for a press machine used to press-fit a connector to a printed circuit board includes a press motor operable in a pressing operation, a driver assembly operably coupled to the press motor and movable during the pressing operation, and a press anvil operably coupled to the driver assembly and movable by the driver assembly during the pressing operation. The press anvil has a load cell housing holding a load cell and a contact plate coupled to the load cell housing and engaging the load cell. The contact plate has a contact surface configured to engage the connector or a seating tool for the connector and configured to press the connector toward the printed circuit board during the pressing operation. The load cell measures a pressing load of the contact plate during the pressing operation.

19 Claims, 3 Drawing Sheets

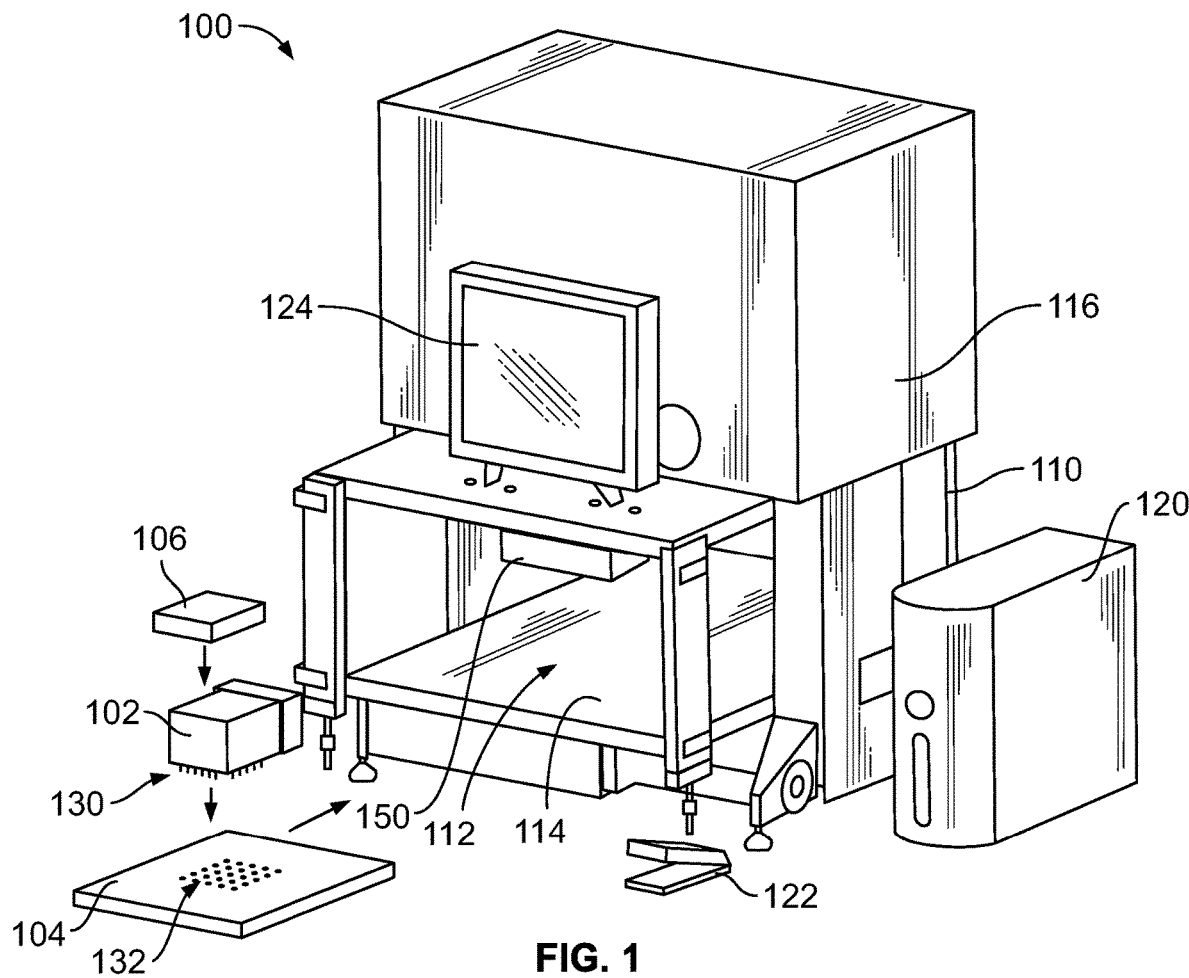
FIG. 1
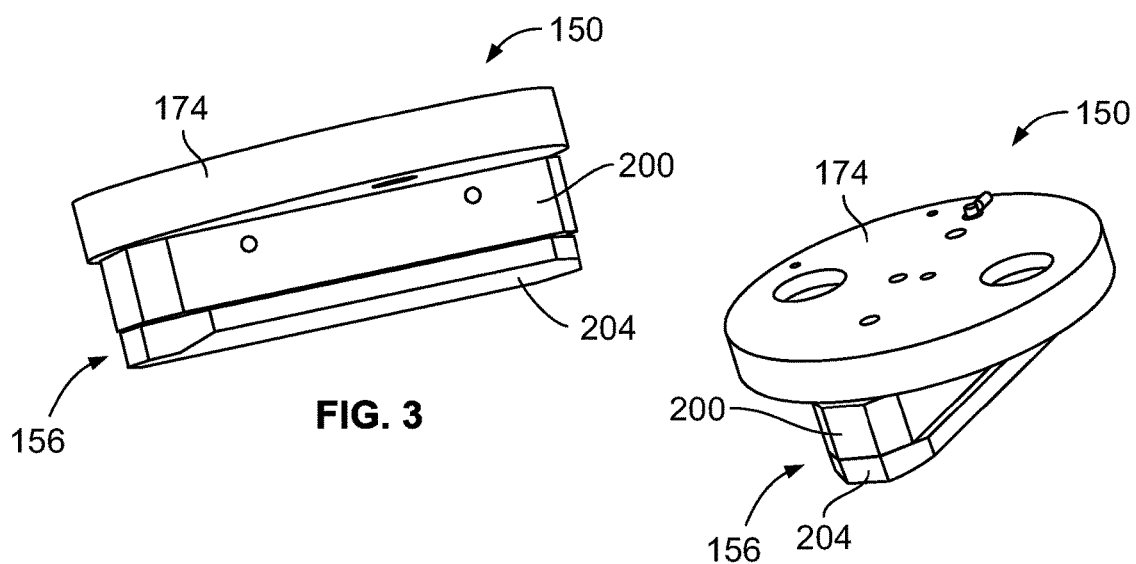
FIG. 3
FIG. 4

PRESS HEAD FOR A PRESS MACHINE

BACKGROUND OF THE INVENTION

The subject matter herein relates generally to a press head for a press machine.

Press machines are used to press-fit connectors to printed circuit boards. The connectors and the printed circuit boards are loaded into the press machine with press-fit pins of the connector aligned with the holes of the printed circuit board. The press machine includes a press head having a press anvil that presses downward on the connector, or a seating tool arranged on the connector, to press the press-fit pins into the vias. However, if the connector is misaligned relative to the printed circuit board, the press-fit pins may be damaged during the pressing operation. Additionally, it may not be readily apparent that some of the press-fit pins were damaged during the pressing operation leading to sale of damaged or defective products to customers.

Known press machines have monitoring systems for quality control and monitor the pressing operation to determine if the connector is improperly mounted to the printed circuit board. For example, some known press machines include load cells used to detect loading forces during the pressing operation. The monitoring system of the press machine monitors the press forces during the pressing operation for anomalies. However, known press machines that include load cells are not without disadvantages. For example, it is difficult to accurately measure some loading forces, such as forces on the low end of the force scale. For example, the multiple mechanical interfaces between the connector and the load cells through the press head detrimentally affect the force loads measured at the load cells, particularly the forces measured at the beginning of the press cycle.

A need remains for a press machine having improved force measurement accuracy.

BRIEF DESCRIPTION OF THE INVENTION

In one embodiment, a press head for a press machine used to press-fit a connector to a printed circuit board is provided including a press motor operable in a pressing operation, a driver assembly operably coupled to the press motor and movable during the pressing operation, and a press anvil operably coupled to the driver assembly and movable by the driver assembly during the pressing operation. The press anvil has a load cell housing holding a load cell and a contact plate coupled to the load cell housing and engaging the load cell. The contact plate has a contact surface configured to engage the connector or a seating tool for the connector and configured to press the connector toward the printed circuit board during the pressing operation. The load cell measures a pressing load of the contact plate during the pressing operation.

In another embodiment, a press head for a press machine used to press-fit a connector to a printed circuit board is provided including a press motor operable in a pressing operation, a driver assembly operably coupled to the press motor and movable during the pressing operation, and a press anvil operably coupled to the driver assembly and movable by the driver assembly during the pressing operation. The press anvil has a load cell housing holding a load cell and a contact plate engaging the load cell. The press anvil has a pre-load screw and a pre-load counterbalance spring coupled between the contact plate and the load cell housing to pre-load the contact plate against the load cell. The contact plate has a contact surface configured to engage the connector or a seating tool for the connector and configured to press the connector toward the printed circuit board during the pressing operation. The load cell measures a pressing load of the contact plate during the pressing operation.

In a further embodiment, a press machine is provided used to press-fit a connector to a printed circuit board. The press machine includes a frame having a receptacle and a support surface at a bottom of the receptacle configured to receive the printed circuit board and the connector on the support surface and a press head coupled to the frame and positioned above the support surface to operably engage the connector to press-fit the connector onto the printed circuit board. The press head includes a press motor operable in a pressing operation, a driver assembly operably coupled to the press motor and movable during the pressing operation, and a press anvil operably coupled to the driver assembly and movable by the driver assembly during the pressing operation. The press anvil has a load cell housing holding a load cell and a contact plate coupled to the load cell housing and engaging the load cell. The contact plate has a contact surface configured to engage the connector or a seating tool for the connector and configured to press the connector toward the printed circuit board during the pressing operation. The load cell measures a pressing load of the contact plate during the pressing operation.

BRIEF DESCRIPTION OF THE DRAWINGS

FIG. 1 illustrates a press machine used to press-fit a connector to a printed circuit board in accordance with an exemplary embodiment.

FIG. 3 is a bottom perspective view of a portion of the press head in accordance with an exemplary embodiment.

FIG. 4 is a top perspective view of a portion of the press head in accordance with an exemplary embodiment.

DETAILED DESCRIPTION OF THE INVENTION

Figure 2:
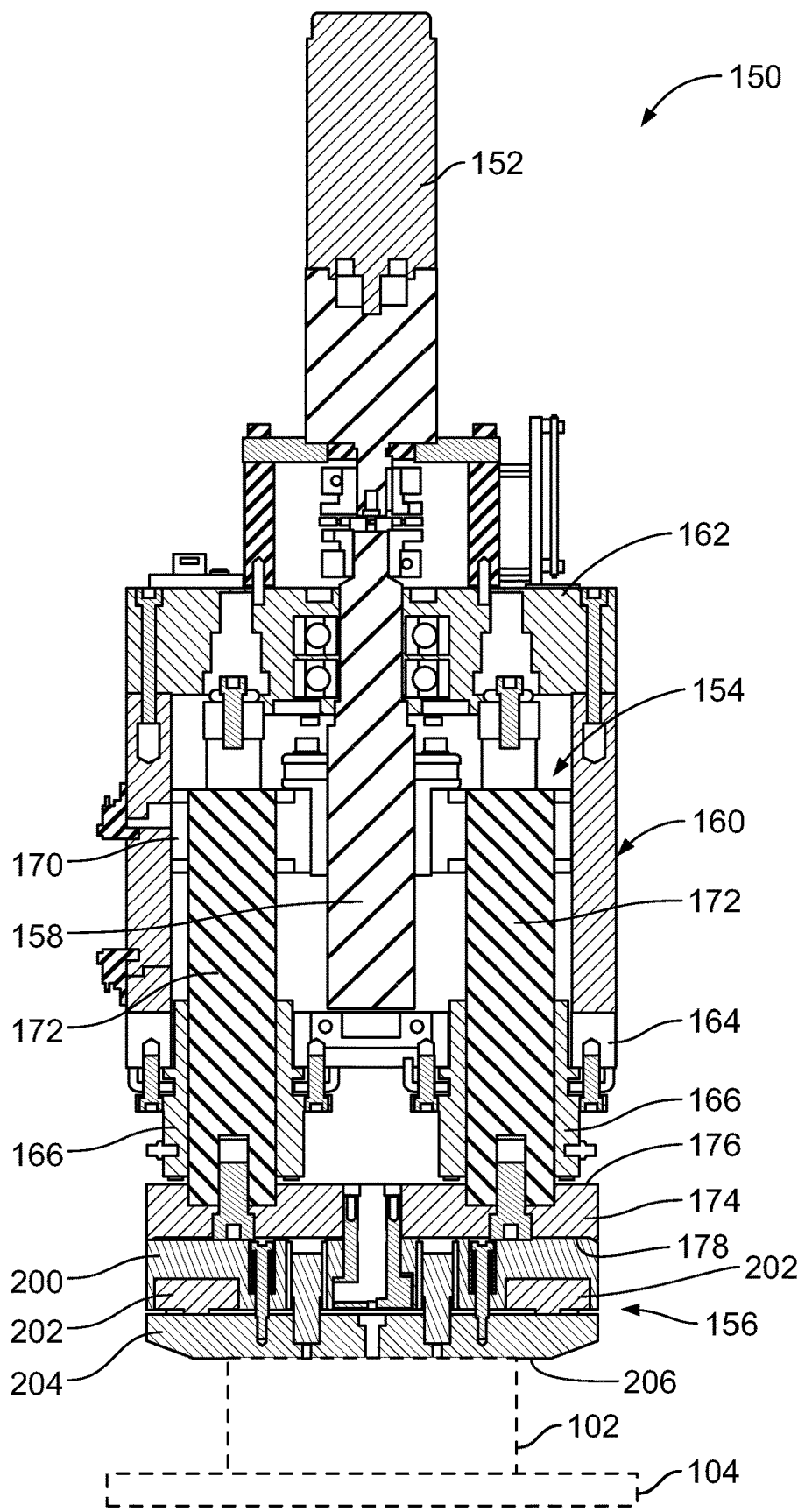
FIG. 2 is a schematic illustration of a press head of the press machine in accordance with an exemplary embodiment.

FIG. 1 illustrates a press machine 100 used to press-fit a connector 102 to a printed circuit board 104 in accordance with an exemplary embodiment. The press machine 100 includes a frame 110 having a receptacle 112 and a support surface 114 and a bottom of the receptacle 112. The receptacle 112 is configured to receive the printed circuit board 104 and the connector 102 on the support surface 114. Optionally, a seating tool 106 may be used to press against the connector 102. The seating tool 106 may be sized and shaped to engage the connector 102. Optionally, the seating tool 106 may include locating features for locating the seating tool 106 relative to the connector 102. The seating tool 106 provides a pressing surface for the press machine 100 to press against to mount the connector 102 to the printed circuit board 104 during a pressing operation. In alternative embodiments, the press machine 100 may press directly against the top of the connector 102 rather than the seating tool 106.

The press machine 100 includes a press head 150 used to press-fit the connector 102 to the printed circuit board 104 during the pressing operation. The press head 150 is operated to press downward against the top of the connector 102 and/or the seating tool 106 during the pressing operation. The press machine 100 may include one or more walls or panels forming a cabinet 116 surrounding various components, such as the press head 150, and/or the receptacle 112.

The press machine 100 includes a controller 120 for controlling operation of the press machine 100. The controller 120 may include a computer or other processing unit for controlling operation of the press machine 100. In an exemplary embodiment, the press machine 100 includes a user interface 122 for controlling operation of the press machine 100. The operator may interact with the user interface 122 to control the pressing operation. In the illustrated embodiment, the user interface 122 includes a foot pedal for controlling operation of the press machine 100. Other types of user interfaces may be used in alternative embodiments, such as a push button, a keyboard, or another type of input device. In an exemplary embodiment, the press machine 100 includes a display 124 for displaying information to the operator. The user interface 122 and the display 124 may be communicatively coupled to the controller 120.

The connector 102 is configured to be press-fit to the printed circuit board 104. In an exemplary embodiment, the connector 102 includes a plurality of press-fit pins 130 configured to be press-fit into plated vias 132 of the printed circuit board 104. In an exemplary embodiment, the press machine 100 monitors the pressing operation for quality control. For example, the press machine 100 may include one or more load sensors to sense load forces during the pressing operation. The monitoring system may analyze the load forces to determine that the connector 102 is properly mounted to the printed circuit board 104. For example, if one or more of the press-fit pins 130 are improperly received in the corresponding vias 132, the monitoring system may detect such occurrence based on the measured load forces. For example, there may be a spike in load forces if the press-fit pins 130 bottom out against the printed circuit board 104 rather than load into the vias 132. Such bottoming out may cause the press-fit pins 130 to bend during the loading operation causing damage to the press-fit pins 130 and/or causing in proper mating of the connector 102 to the printed circuit board 104.

FIG. 2 is a schematic illustration of the press head 150 in accordance with an exemplary embodiment. The press head 150 includes a press motor 152 operable in the pressing operation. The press head 150 includes a driver assembly 154 operably coupled to the press motor 152 and movable during the pressing operation. The press head 150 includes a press anvil 156 operably coupled to the driver assembly 154 and movable by the driver assembly 154 during the pressing operation.

In the illustrated embodiment, the press motor 152 is provided at the top of the press head 150. The press motor 152 may be an electric motor having a rotating motor shaft; however, other types of press actuators may be used in alternative embodiments, such as a hydraulic actuator, a pneumatic actuator or another type of press actuator. In an exemplary embodiment, a driveshaft 158 is rotated by the press motor 152 to drive the driver assembly 154. The driveshaft 158 may be a ball screw or another type of driveshaft.

The press head 150 includes a press head frame 160 that supports the press motor 152 and the driver assembly 154.

The press head frame 160 may be coupled to the frame 110 of the press machine 100 (shown in FIG. 1). The press head frame 160 includes an upper plate 162 and a lower plate 164. The driveshaft 158 is supported by the upper plate 162 and/or the lower plate 164, such as using bearings. In an exemplary embodiment, the lower plate 164 holds sleeve bearings 166. The driver assembly 154 is slidable within the sleeve bearings 166.

The driver assembly 154 is operably coupled to the driveshaft 158. The driveshaft 158 moves the driver assembly 154 in a vertical direction during the pressing operation. The driver assembly 154 is moved downward during the pressing operation to drive the press anvil 156 against the connector 102 or the seating tool 106 (shown in FIG. 1) to mount the connector 102 to the printed circuit board 104.

In an exemplary embodiment, the driver assembly 154 includes a carriage 170 coupled to the driveshaft 158. The carriage 170 moves up and down on the driveshaft 158 as the driveshaft 158 is rotated by the press motor 152. The driver assembly 154 includes drive rods 172 held by and movable with the carriage 170. The drive rods 172 are received in corresponding sleeve bearings 166. The drive rods 172 slide vertically up and down in the sleeve bearings 166. The sleeve bearings 166 restrict movement of the drive rods 172 in the horizontal direction. The driver assembly 154 includes a drive plate 174 coupled to the bottoms of the drive rods 172. The drive plate 174 has a top 176 and a bottom 178. The drive rods 172 are coupled to the top 176 of the drive plate 174. The drive plate 174 is moved up and down by the drive rods 172 with the carriage 170. In an exemplary embodiment, the press anvil 156 is coupled to the bottom 178 of the drive plate 174. The press anvil 156 is movable with the drive plate 174.

In an exemplary embodiment, the press anvil 156 includes a load cell housing 200 holding one or more load cells 202 and a contact plate 204 coupled to the load cell housing 200. The contact plate 204 engages the load cells 202. The contact plate 204 has a contact surface 206 configured to engage the connector 102 or the seating tool 106 for the connector 102. The contact surface 206 is configured to press against the connector 102 or the seating tool 106 during the pressing operation. The load cells 202 measure a pressing load of the contact plate 204 on the connector 102 or the seating tool 106 during the pressing operation.

FIG. 3 is a bottom perspective view of a portion of the press head 150 in accordance with an exemplary embodiment. FIG. 4 is a top perspective view of a portion of the press head 150 in accordance with an exemplary embodiment. FIGS. 3 and 4 show the press anvil 156 coupled to the drive plate 174.

In the illustrated embodiment, the drive plate 174 is circular; however, the drive plate 174 may have other shapes in alternative embodiments. In the illustrated embodiment, the load cell housing 200 and the contact plate 204 are elongated, such as being generally rectangular with curved ends; however, the load cell housing 200 and/or the contact plate 204 may have other shapes in alternative embodiments. Optionally, the load cell housing 200 may have a different shape than the contact plate 204. For example, the load cell housing 200 may have a similar shape as the drive plate 174. The contact plate 204 may have a particular shape corresponding to the shape of the connector 102 or the seating tool 106 for interfacing with the connector 102 or the seating tool 106.

Figure 5:
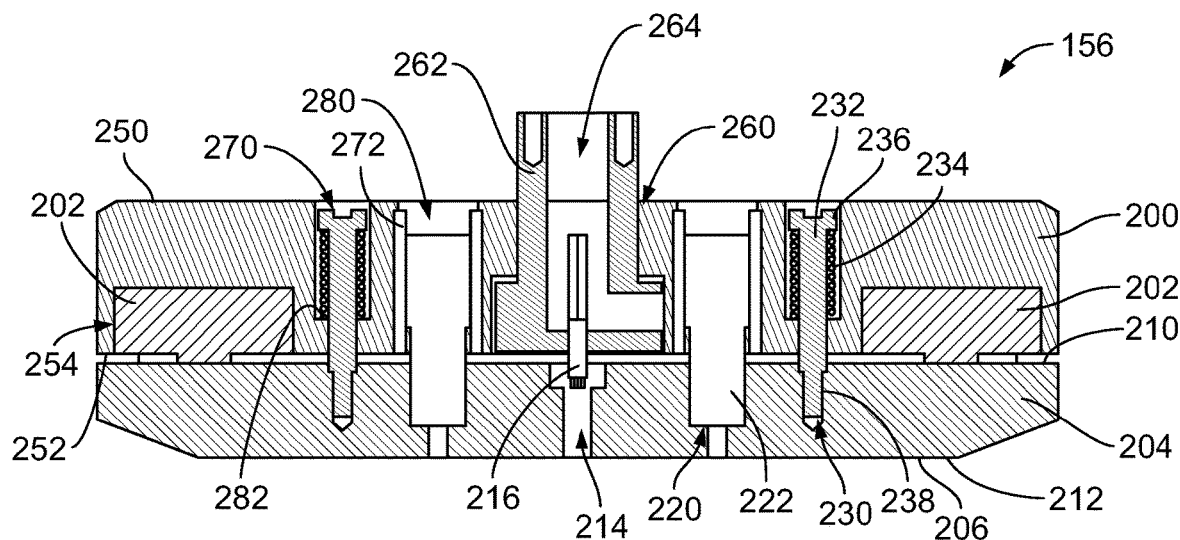
FIG. 5 is a cross-sectional view of a press anvil of the press head in accordance with an exemplary embodiment.

FIG. 5 is a cross-sectional view of the press anvil 156 in accordance with an exemplary embodiment. The contact plate 204 includes a top 210 and a bottom 212. The contact surface 206 is provided at the bottom 212. The top 210 faces the load cell housing 200. The top 210 is configured to engage the load cells 202. Pressing forces are transferred from the contact plate 204 to the load cells 202 by the top 210 of the contact plate 204.

In an exemplary embodiment, the contact plate 204 includes a sensor channel 214 that receives a sensor, such as a proximity sensor 216. The proximity sensor 216 is used to sense presence of the connector 102 or the seating tool 106 for the connector 102. The press head is allowed to operate when the presences is detected and is restricted from operating when the connector 102 or the seating tool 106 is not present.

In an exemplary embodiment, the contact plate 204 includes bores 220 that receive guide members 222. The guide members 222 may be used to guide movement of the contact plate 204 relative to the load cell housing 200 in a vertical direction. The guide members 222 may be secured in the bores 220 using fasteners. However, the guide members 222 may be secured in the bores 220 by other means in alternative embodiments, such as being threadably coupled to the contact plate 204 in the bores 220, using adhesive, being press-fit in the bores 220 or by other means.

In an exemplary embodiment, the contact plate 204 includes bores 230 that receive preload screws 232. The preload screws 232 are used to couple the contact plate 204 to the load cell housing 200. In an exemplary embodiment, the preload screws 232 preload the contact plate 204 against the load cells 202 to provide an initial, preload force at the load cells 202. In an exemplary embodiment, the preload screws 232 are preloaded by preload counterbalance springs 234. The preload counterbalance springs 234 provide a uniform preload force on the load cells 202 by lifting upward on the preload screws 232 to hold the contact plate 204 against the load cells 202. In an exemplary embodiment, the preload screws 232 are threadably coupled to the contact plate 204 in the bores 230. For example, the preload screws 232 include a head 236 and a threaded end 238 the head 236 is located in the load cell housing 200 with the preload counterbalance spring 234. The threaded end 238 is threadably coupled to the contact plate 204 in the bore 230 of the contact plate 204. Other arrangements are possible in alternative embodiments, such as with the head 236 and the preload counterbalance spring 234 in the contact plate 204 and the threaded end 238 in the load cell housing 200.

The load cell housing 200 includes a top 250 and a bottom 252. The contact plate 204 is provided at the bottom 252 of the load cell housing 200. The load cells 202 are provided at the bottom 252 of the load cell housing 200. For example, the load cell housing 200 includes pockets 254 at the bottom 252 that receive corresponding load cells 202. The load cells 202 are received in the pockets 254 such that the load cells 202 are able to interact with the contact plate 204. For example, the load cells 202 protrude from the bottom 252 to engage the top 210 of the contact plate 204.

The load cell housing 200 includes a central opening 260 that receives a hub 262. The hub 262 is configured to be coupled to the drive plate 174. In an exemplary embodiment, the load cell housing 200 is rotatable on the hub 262, such as for positioning the press anvil 156 relative to the connector 102 or the seating tool 106. In an exemplary embodiment, the hub 262 includes a cable bore 264 that receives cables from the proximity sensor 216 and/or the load cells 202.

The load cell housing 200 includes bores 270 that receive guide bearings 272 the guide bearings 272 receive the guide members 222. The guide bearings 272 guide movement of the guide members 222, and thus the contact plate 204, relative to the load cell housing 200 in a vertical direction. In an exemplary embodiment, multiple guide bearings 272 and guide members 222 are provided. The guide bearings 272 and the guide members 222 prevent pivoting or rotation of the contact plate 204 relative to the load cell housing 200, such as when the press anvil 156 is offset loaded relative to the connector 102 or the seating tool 106. For example, when the press anvil 156 is offset relative to the connector 102 or the seating tool 106 closer to one end of the contact plate 204 and further from the opposite end of the contact plate 204, the guide bearings 272 and the guide members 222 ensure that pressure on one side of the contact plate 204 is transferred to the other side of the contact plate 204 by forcing movement in the vertical direction area as such, both load cells 202 receive similar load forces.

The load cell housing 200 includes bores 280 that receive the preload screws 232. In the illustrated embodiment, each bore 280 has a mounting surface 282. The preload counterbalance spring 234 is captured between the mounting surface 282 and the head 236 of the preload screw 232. Spring forces from the preload counterbalance spring 234 press upward against the head 236. The upper spring force is transferred to the contact plate 204 by the preload screw 232 to lift upward on the contact plate 204, thus preloading the contact plate 204 against the load cells 202.

Figure 6:
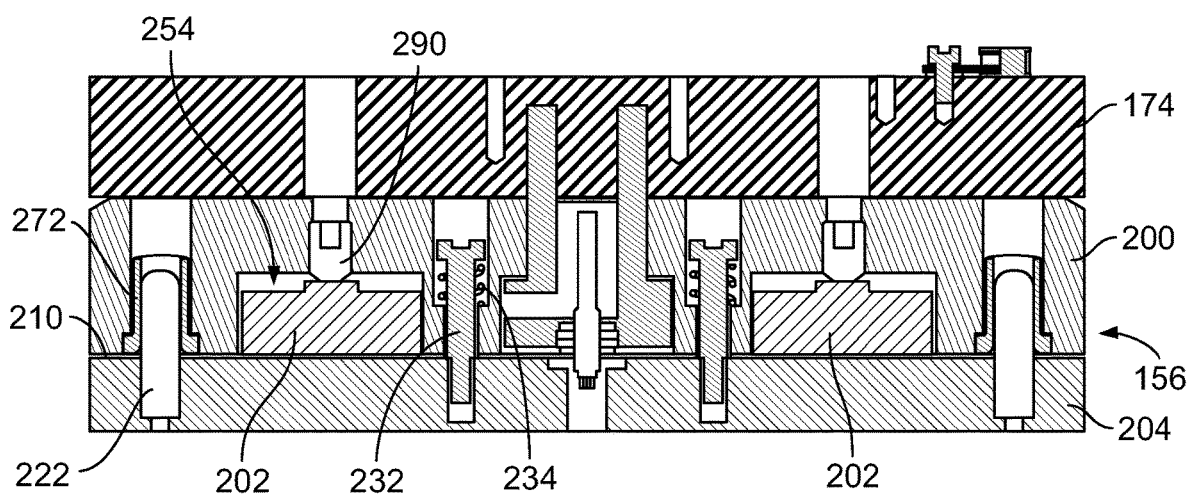
FIG. 6 is a cross-sectional view of the press anvil in accordance with an exemplary embodiment.

FIG. 6 is a cross-sectional view of the press anvil 156 in accordance with an exemplary embodiment showing the press anvil 156 coupled to the drive plate 174. In the illustrated embodiment, the positions of the load cells 202, the preload screws 232, the preload counterbalance springs 234, the guide members 222 and the guide bearings 272 are different than the embodiment illustrated in FIG. 5; however, like components are identified with like reference numerals.

In the illustrated embodiment, the load cell housing 200 includes preload adjustment screws 290 used to adjust the preload force on the load cells 202. The preload adjustment screws 290 are used to ensure that the contact plate 204 is parallel with the support surface 114 and thus the printed circuit board 104. In the illustrated embodiment, the load cells 202 are inverted relative to the orientation shown in FIG. 5. The load cells 202 are supported on the top 210 of the contact plate 204 and forced upward into the pockets 254 in the load cell housing 200 to engage the preload adjustment screws 290. The pressing forces on the contact plate 204 are sensed by the load cells 202.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A press head for a press machine used to press-fit a connector to a printed circuit board, the press head comprising:
   a press motor operable in a pressing operation;
   a driver assembly operably coupled to the press motor and movable during the pressing operation; and
   a press anvil operably coupled to the driver assembly and movable by the driver assembly during the pressing operation, the press anvil having a load cell housing holding a load cell, the press anvil having a contact plate coupled to the load cell housing and engaging the load cell, the press anvil having a preload screw connecting the contact plate and the load cell housing, the preload screw including a preload counterbalance spring operably coupled to and directly engaging the preload screw to press against the preload screw, the preload counterbalance spring being operably coupled between the contact plate and the load cell housing to preload the contact plate against the load cell, the contact plate having a connector contact surface sized and shaped complementary to the connector to fit and hold the connector or a seating tool for the connector to press the connector toward the printed circuit board during the pressing operation, the load cell measuring a pressing load of the contact plate during the pressing operation.

2. The press head of claim 1, wherein the contact plate has a top and a bottom, the contact surface provided at the bottom, the top engaging the load cell.

3. The press head of claim 1, wherein the load cell is a first load cell, the load cell housing holding a second load cell remote from the first load cell, the second load cell engaging the contact plate.

4. The press head of claim 1, wherein the load cell housing includes a bore having a mounting surface, the contact plate includes a bore, the preload screw having a head and a threaded end, the head being received in the bore of the load cell housing, the threaded end being threadably coupled to the contact plate in the bore of the contact plate.

5. The press head of claim 4, wherein the preload counterbalance spring is located between the head of the preload screw and the mounting surface of the bore of the load cell housing.

6. The press head of claim 1, wherein the press anvil includes a guide bearing in one of the load cell housing and the contact plate and a guide member in the other of the load cell housing and the contact plate, the guide member being received in the guide bearing to guide movement of the contact plate relative to the load cell housing in a vertical direction.

7. The press head of claim 1, wherein the driver assembly includes a drive plate engaging a top of the load cell housing and pressing against the load cell housing during the pressing operation.

8. The press head of claim 7, wherein the driver assembly includes drive rods engaging the drive plate and pressing against the drive plate during the pressing operation.

9. The press head of claim 1, wherein the press anvil further comprises a proximity sensor held by one of the load cell housing and the contact plate configured to sense proximity of the contact plate to the connector or the seating tool for the connector.

10. A press head for a press machine used to press-fit a connector to a printed circuit board, the press head comprising:
    a press motor operable in a pressing operation;
    a driver assembly operably coupled to the press motor and movable during the pressing operation; and
    a press anvil operably coupled to the driver assembly and movable by the driver assembly during the pressing operation, the press anvil having a load cell housing holding a load cell, the press anvil having a contact plate engaging the load cell, the press anvil having a preload screw and a preload counterbalance spring operably coupled to and directly engaging the preload screw to press against the preload screw, the preload screw and the preload counterbalance spring being coupled between the contact plate and the load cell housing to preload the contact plate against the load cell, the contact plate having a contact surface configured to fit and hold the connector or a seating tool for the connector and configured to press the connector toward the printed circuit board during the pressing operation, the load cell measuring a pressing load of the contact plate during the pressing operation.

11. The press head of claim 10, wherein the contact plate has a top and a bottom, the contact surface provided at the bottom, the top engaging the load cell.

12. The press head of claim 10, wherein the load cell is a first load cell, the load cell housing holding a second load cell remote from the first load cell, the second load cell engaging the contact plate.

13. The press head of claim 10, wherein the load cell housing includes a bore having a mounting surface, the contact plate includes a bore, the preload screw has a head and a threaded end, the head being received in the bore of the load cell housing, the threaded end being threadably coupled to the contact plate in the bore of the contact plate, the preload counterbalance spring being positioned between the head of the preload screw and the mounting surface of the bore of the load cell housing.

14. The press head of claim 10, wherein the press anvil includes a guide bearing in one of the load cell housing and the contact plate and a guide member in the other of the load cell housing and the contact plate, the guide member being received in the guide bearing to guide movement of the contact plate relative to the load cell housing in a vertical direction.

15. A press machine used to press-fit a connector to a printed circuit board, the press machine comprising:
    a frame having a receptacle and a support surface at a bottom of the receptacle, the support surface supporting the printed circuit board and the connector in the receptacle; and
    a press head coupled to the frame and positioned above the support surface to operably engage the connector to press-fit the connector onto the printed circuit board, the press head comprising:
    a press motor operable in a pressing operation;
    a driver assembly operably coupled to the press motor and movable during the pressing operation; and
    a press anvil operably coupled to the driver assembly and movable by the driver assembly during the pressing operation, the press anvil having a load cell housing holding a load cell, the press anvil having a contact plate coupled to the load cell housing and engaging the load cell, the press anvil having a preload screw and a preload counterbalance spring connecting the contact plate and the load cell housing, the preload counterbalance spring operably coupled to and directly engaging the preload screw to press against the preload screw, the preload screw and the preload counterbalance spring being operably coupled between the contact plate and the load cell housing to preload the contact plate against the load cell, the contact plate having a connector contact surface sized and shaped complementary to the connector to fit and hold the connector or a seating tool for the connector, the contact plate driving the connector contact surface into the connector to press the connector toward the printed circuit board during the pressing operation, the load cell measuring a pressing load of the contact plate during the pressing operation.

16. The press machine of claim 15, wherein the load cell housing includes a bore having a mounting surface, the contact plate includes a bore, the preload screw having a head and a threaded end, the head being received in the bore of the load cell housing, the threaded end being threadably coupled to the contact plate in the bore of the contact plate, the preload counterbalance spring being located between the head of the preload screw and the mounting surface of the bore of the load cell housing.

17. The press machine of claim 15, wherein the press anvil includes a guide bearing in one of the load cell housing and the contact plate and a guide member in the other of the load cell housing in the contact plate, the guide member being received in the guide bearing to guide movement of the contact plate relative to the load cell housing in a vertical direction.

18. The press machine of claim 15, wherein the preload counterbalance spring is a coil spring.

19. The press head of claim 1, wherein the preload counterbalance spring is a coil spring.

* * * * *